US010651902B2

(12) United States Patent
Guan

(10) Patent No.: US 10,651,902 B2
(45) Date of Patent: May 12, 2020

(54) REDUCING DISTORTIONS IN AMPLIFIED SIGNALS RADIATED BY A MULTIPLE ANTENNA SYSTEM

(71) Applicant: Alcatel Lucent, Nozay (FR)

(72) Inventor: Lei Guan, Blanchardstown (IE)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 16/307,816

(22) PCT Filed: Jun. 8, 2017

(86) PCT No.: PCT/EP2017/063993
§ 371 (c)(1),
(2) Date: Dec. 6, 2018

(87) PCT Pub. No.: WO2017/211970
PCT Pub. Date: Dec. 14, 2017

(65) Prior Publication Data
US 2019/0312613 A1 Oct. 10, 2019

(30) Foreign Application Priority Data

Jun. 9, 2016 (EP) ..................................... 16305676

(51) Int. Cl.
*H04B 7/0417* (2017.01)
*H04B 1/04* (2006.01)
(Continued)

(52) U.S. Cl.
CPC ......... *H04B 7/0417* (2013.01); *H03F 1/3247* (2013.01); *H03F 3/24* (2013.01);
(Continued)

(58) Field of Classification Search
CPC .. H04B 7/0417; H04B 1/0475; H04B 7/0634; H04B 2001/0425; H04B 2001/0433
(Continued)

(56) References Cited

U.S. PATENT DOCUMENTS 8,462,881 B2 * 6/2013 Neumann ............. H04L 27/368
375/295
9,923,582 B2 * 3/2018 Lee .......................... H04B 1/04
(Continued)

FOREIGN PATENT DOCUMENTS

CN 101114811 A 1/2008
CN 101155158 A 4/2008
(Continued)

OTHER PUBLICATIONS

International Search Report for PCT/EP2017/063993 dated Oct. 4, 2017.

*Primary Examiner* — Juan A Torres
(74) *Attorney, Agent, or Firm* — Fay Sharpe LLP

(57) ABSTRACT

Circuitry, method and computer program for reducing distortions in a plurality of amplified signals to be radiated by a multiple antenna system. The circuitry comprising: a plurality of inputs for receiving digital signals for a plurality of forward data paths; routing circuitry for routing the digital signals received at the plurality of inputs to pre-distortion logic for applying a pre-distortion function to each of the signals, the pre-distortion logic being operable to forward each of the signals towards a digital to radio frequency converter and subsequent amplifier for amplifying the signals prior to the signals being radiated; one or more feedback paths each comprising processing logic for comparing a feedback signal generated from one of the amplified signals with a corresponding signal received at one of the inputs to determine a function to be applied by the pre-distortion logic to the input signal; selecting logic for selecting the input signal to be provided with the feedback.

13 Claims, 4 Drawing Sheets

(51) Int. Cl.
*H04B 7/06* (2006.01)
*H03F 1/32* (2006.01)
*H03F 3/68* (2006.01)
*H03F 3/24* (2006.01)
*H04B 17/10* (2015.01)
*H04B 17/14* (2015.01)
*H04L 5/00* (2006.01)
*H04L 27/36* (2006.01)

(52) U.S. Cl.
CPC ............ *H03F 3/68* (2013.01); *H04B 1/0475* (2013.01); *H04B 1/0483* (2013.01); *H04B 7/0634* (2013.01); *H04B 17/102* (2015.01); *H04B 17/14* (2015.01); *H03F 2200/451* (2013.01); *H04B 2001/0425* (2013.01); *H04B 2001/0433* (2013.01); *H04L 5/0023* (2013.01); *H04L 27/368* (2013.01)

(58) Field of Classification Search
USPC ........................................................ 375/297
See application file for complete search history.

(56) References Cited

U.S. PATENT DOCUMENTS

| | | |
|---|---|---|
| 2002/0021764 A1* | 2/2002 | Posti .................... H03F 1/3247 375/296 |
| 2006/0133535 A1 | 6/2006 | Jung et al. |
| 2008/0101501 A1 | 5/2008 | Gupta |
| 2011/0136452 A1 | 6/2011 | Pratt et al. |
| 2012/0281777 A1 | 11/2012 | Ho et al. |
| 2014/0064341 A1 | 3/2014 | Johansson et al. |
| 2016/0344483 A1* | 11/2016 | Kareisto ................ H04B 17/12 |

FOREIGN PATENT DOCUMENTS

| | | |
|---|---|---|
| CN | 101316250 A | 12/2008 |
| CN | 101478523 A | 7/2009 |
| CN | 101 594 327 A | 12/2009 |

* cited by examiner ns in Amplified
REDUCING DISTORTIONS IN AMPLIFIED SIGNALS RADIATED BY A MULTIPLE ANTENNA SYSTEM

FIELD OF THE INVENTION

The invention relates to the field of multiple antenna systems such as multiple input multiple output MIMO antenna or antenna array and in particular, to systems for feeding signals to such antenna.

BACKGROUND

Massive multiple input and multiple output (Massive MIMO) systems have been widely accepted as one of the key gaming changing technologies for the next generation wireless communications, or 5G ($5^{th}$ Generation) wireless communication systems. The basic concept of Massive MIMO is to provide wireless communication services by utilizing a large number of radiating antennas with corresponding transmitters to service multiple users. By using many transmitters at the same site (centralized) or at different sites (distributed) simultaneously, the frequency spectrum efficiency will be improved, so that the network capacity and data throughput can be significantly increased, thereby providing better services for more users.

Massive MIMO systems involve multiple data streams being multiplexed and mapped to different antennas, linear RF transceivers are required to provide the spatial multiplexing performance using computation-effective linear precoding algorithms. In a practical wireless system with physical RF transmitters, RF power amplifiers (PAs) are required to provide reasonable radiating power from each transmitter. Such amplifiers have a region where they operate linearly and a region beyond this where they do not. Operating in the non-linear region results in signals outside of the required bandwidth and in distortions in the signal. This results not only in the signal itself being difficult to decode, but also provides interference for neighbouring signals. Operating in the linear region addresses this, but operation in this region is not efficient. Thus, these amplifiers if used in a region where they are efficient introduce nonlinear distortion into the signal causing both in-band signal quality degradation (which causes problems to the transmitter itself) and out-of-band spectrum regrowth (which cause problems to others transmitters working in the adjacent frequency band).

To address this problem two approaches are commonly used:

1) Backing-off approach: in this approach, radio frequency power amplifiers are operated in the linear operating region, i.e., backing-off the power from the saturation operating region. A drawback of this conventional approach is that it leads to very low power efficiency.

2) Digital predistortion (DPD) approach: This involves the input signal being pre-distorted to compensate for distortions that will arise at the amplifier, such that the amplified signal has reduced distortions. FIG. 1A shows a conventional DPD-enabled RF transmitter with two signal paths, a forward data path and a feedback data path. The amplified radio frequency signal is sampled and fed back via sampling receiver devices. The attenuator is used for reducing the power of the feedback signal, a down-converter converts the signal from a high frequency radio signal to a lower frequency signal, and an analogue to digital converter returns the signal to a digital signal. This digital signal is then compared with the signal that generated it at the digital signal processing circuit and from this comparison the pre-distortion function applied to the data signal on the forward data path is updated if required to mitigate for any differences detected between the two signals. Due to its satisfactory linearization performance and flexibility, DPD has been largely used as a preferred option to reduce the nonlinear distortion introduced by the RF PAs when driving RF PAs into nonlinear saturation region.

However, directly applying this DPD architecture for multiple RF transmitters based system (like Massive MIMO system) results in a system that is expensive both in hardware and in power. FIG. 1B shows such a device.

SUMMARY

A first aspect of the present invention provides, circuitry for reducing distortions in a plurality of amplified signals to be radiated by a multiple antenna system, said circuitry comprising: a plurality of inputs each for receiving a digital signal for a plurality of forward data paths; routing circuitry for routing said input digital signals to pre-distortion logic for applying a pre-distortion function to each of said input digital signals, said pre-distortion logic being operable to forward each of said signals towards a digital to radio frequency converter and subsequent amplifier for amplifying said signals prior to said signals being radiated; one or more feedback paths each comprising processing logic for comparing a feedback signal generated from one of said amplified signals with said digital input signal from which said amplified signal stemmed, to determine a function to be applied by said pre-distortion logic to said input digital signal; selecting logic for selecting said input digital signal to be provided with said feedback.

The inventor of the present invention recognised that providing a feedback path for determining a pre-distortion function to correct for non-linearities of an amplifier in a system feeding a multiple antenna system could be very expensive on both hardware and power where feedback signals and corresponding processing were provided for each amplified signal path. They also recognised that in many circumstances the signals driving the amplifiers might be relatively stable within a timeframe. Furthermore, the characteristics of each amplifier once it has reached operational temperature are also generally quite stable. The above leads to the required pre-distortion functions for compensating for the non-linearities also being relatively stable over a timeframe, such that continuously using feedback to update these functions may not be required. This realisation enabled the inventor to also recognise that with appropriate selection an input signal could be provided with feedback for only some of the time, allowing the feedback path to be powered down or re-used for another forward data path for the rest of the time. In this way a system with reduced power and perhaps hardware requirements and yet high performance is provided.

The feedback path feeds a pre-distorted amplified radio frequency signal back to be compared with the input digital signal from which it stemmed. Any differences between the amplified and input signals can be determined, which difference provide an indication of the efficacy of the pre-distortion function to compensate for distortions generated by the amplifier. These detected differences can then be used as a basis for updating the processing function if required, by perhaps updating the processing function parameters in order to mitigate for these detected differences.

Although the number of feedback paths may be the same as the number of inputs, the selecting logic simply selecting which feedback paths to be operational at any time, in some embodiments, the number of feedback paths is less than the number of inputs.

Having fewer feedback paths than the number of input allows for both hardware and power savings with a feedback path being dynamically shared between signals using appropriate selecting logic.

In some embodiments, said selecting logic is operable to periodically select a different input to be provided with said feedback.

The selecting logic may operate in a number of different ways to select which input is to receive feedback. In some cases, it may make the selections on a periodic basis such that feedback is provided to each signal in a shared time manner. This may be configurable or programmable such that the timing periods can be amended. Alternatively, the selection logic may make its selections based upon detected demand. This may involve an operator controlling the selection or it may involve some sort of automatic perhaps self-learning method of selection.

In some embodiments, said selecting logic is operable to power down a feedback path and corresponding processing circuitry when not selected. Powering down any non-selected feedback paths provides a power saving and leads to more efficient circuitry.

In some embodiments, said selecting logic comprises switching circuitry to selectively route an input digital signal to said processing logic.

Where processing logic is shared between inputs then the selecting logic will select the appropriate input signal for routing to the processing logic for comparison with the feedback signal. This selecting logic may comprise switching circuitry which is controlled by a control signal from the selecting logic to route the input digital signal that is to receive feedback to the processing logic for comparison with the feedback signal.

The selecting logic may also comprises switching circuitry to selectively route a feedback signal to said processing logic and further switching circuitry to selectively route a signal from said processing logic to a corresponding pre-distortion logic unit. In this way the processing logic can be dynamically shared between input signals by selecting and routing the appropriate signals to the processing logic and connecting the processing logic with the appropriate pre-distortion logic unit in a time division multiplexed manner so that one processing logic unit can be used to update several different pre-distortion functions at different times.

In some embodiments, said routing circuitry comprises a plurality of forward data paths corresponding to said plurality of inputs each of said plurality of forward data paths comprising pre-distortion logic.

The routing circuitry may simply be a number of inputs connected to a number of pre-distortion logic units. In other embodiments, said routing circuitry comprises first switching logic for selectively connecting at least one of said inputs to at least one of a plurality of pre-distortion logic units.

Having hardwired inputs to the pre-distortion logic makes for a simple system but one that is not very flexible. Providing routing circuitry where input paths can be connected to different pre-distortion logic units, allows for greater flexibility and for some parts of the system to be powered down at certain times, inputs that are active being routed to active powered up pre-distortion logic units. In this way a multiple antenna system that is very flexible can be provided where a subset of the antennas can be used at particular times, while others are not in use if appropriate.

In some embodiments, said circuitry further comprises further switching circuitry for selectively routing signals output from said plurality of pre-distortion logic units to a plurality of outputs for connection to a plurality of radio frequency to digital converters and amplifiers, and for selectively routing said at least one feedback signal to said at least one processing logic unit.

In addition to having flexible routing at the input, flexible routing can be provided at the output so that the signals output from the pre-distortion logic can be routed to different digital to radio frequency chains within an antenna feed system. This again allows for a flexible system where subsets of the system may be powered down at certain times.

In some embodiments, said circuitry comprises a plurality of processing logic units, said circuitry being arranged in at least two groups each group comprising at least two pre-distortion logic units and at least one processing logic unit, each group being operable to function independently of another group.

The circuitry may be divided into groups either physically or logically. Each group can then be operated independently which allows different groups to be assigned to different operators, to be operational or non-operational at different times, and/or be assigned for different applications. In this regard, certain applications may transmit signals that have more variation and are less stable than signals from other applications and thus, the pre-distortion functions for these signals may need to be updated more regularly. Dividing the circuitry into groups allows more feedback paths to be provided for certain groups, which may be serving certain applications with more variable signals than for others, thereby retaining quality while still improving efficiency.

Where one has flexible routing at the input and the output of the circuitry, then there is further scope for flexibly routing particular signals to particular groups. In this regard, each group has at least one processing unit and at least two pre-distortion logic units allowing for at least one feedback path. A processing logic unit may be regarded as some processing logic that is operable to process a feedback signal by comparing it with a corresponding input signal. Two processing logic units are operable to process two feedback signals and may be separate circuitry or may be a conglomeration that can be considered to functionally form two units in that they can independently process two feedback signals. In this arrangement one or more feedback path is provided for each group and the selecting logic will select at least one of the plural input signals to be provided with feedback at any one time. For cases, where the pre-distortion function needs to be more regularly updated a group with a higher number of feedback paths may be provided.

A second aspect of the present invention provides a multiple input multiple output radio frequency transmission system, comprising: a plurality of outputs each for outputting a radio frequency signal to a multiple antenna feeding system; a plurality of inputs each for receiving a digital input signal; circuitry for reducing distortions in a plurality of amplified signals to be radiated by said multiple antenna system according to a first aspect to the present invention, a plurality of digital to radio frequency converters and amplifiers arranged between said circuitry and said plurality of outputs; at least one radio frequency to digital converter arranged to supply a converted output signal to said one or more feedback paths.

A multiple input multiple output radio frequency transmission system suffers from distortions in the amplified signal which can be addressed by using pre-distortion logic. The pre-distortion function to be applied to the input digital signal can be determined by a feedback system that compares the signal which is output having been suitably processed with the input signal. This allows distortions in the signal to be detected and mitigated for. Having a system which allows the input having feedback applied to it to be selected allows for this function to be periodically reviewed. In this way, a system that is both power and potentially hardware efficient is provided that also has a high quality output.

In some embodiments, the multiple input multiple output radio frequency transmission system further comprises further routing circuitry for selectively routing at least one of said output signals to said at least one radio frequency to digital converter.

Where the processing logic in the feedback path is dynamically shared between input signals, it may also be advantageous to provide selective routing of the output signals in the analogue domain as this can allow dynamic sharing of the radio frequency to digital convertors too, as these are only required to be operational when the processing logic is operational. Thus, where a reduced number of processing logic units is used, it may be advantageous to use a reduced number of radio frequency to digital converters.

Thus, in some embodiments the multiple input multiple output radio frequency transmission system comprises a radio frequency to digital converter associated with each output.

In other embodiments, said multiple input multiple output radio frequency transmission system comprises a wideband radio frequency to digital chain, said further routing circuitry routing one or more of said plurality of outputs to said wideband radio frequency to digital chain to form said one or more feedback signals A third aspect of the present invention provides a method of reducing distortions in a plurality of amplified signals to be radiated by a multiple antenna system comprising: routing a plurality of digital signals received at a plurality of inputs to pre-distortion logic for applying a pre-distortion function to each of said input digital signals prior to forwarding each of said signals towards a digital to radio frequency converter and subsequent amplifier; selecting at least one input signal to be provided with feedback; receiving at least one feedback signal formed from a corresponding at least one of said amplified signals; routing said at least one feedback signal to processing logic; comparing at said processing logic, said at least one feedback signal with said at least one selected digital input signal from which said feedback signal stemmed; and determining a function to be applied by said pre-distortion logic to said at least one selected input signal.

In some embodiments, said selecting step comprises periodically selecting a different at least one input signal to be provided with said feedback.

In some embodiments, said selecting step comprises selecting said at least one input signal to be provided with said feedback in dependence upon detected demand.

In some embodiments, said selecting step comprises powering down a feedback path and corresponding processing circuitry when not selected.

In some embodiments, said selecting step comprises selectively routing an input signal to said processing logic.

In some embodiments, said selecting step comprises selectively routing a feedback signal to said processing logic and selectively routing a determined updated pre-distortion function to a corresponding pre-distortion logic unit.

In some embodiments, said routing step comprises selectively connecting at least one of said inputs to at least one of a plurality of pre-distortion logic units.

In some embodiments, said method further comprises selectively routing signals output from each of said plurality of pre-distortion logic units to selected ones of a plurality of outputs for connection to a plurality of radio frequency to digital converters and amplifiers, and selectively routing said at least one feedback signal to said at least one processing logic unit.

In some embodiments said method comprises logically assigning each of said plurality of inputs and a portion of said pre-distortion logic and processing logic to one of a plurality of groups and routing said at least one feedback signal selected for said at least one input to pre-distortion logic and processing logic assigned to a same group.

Logically assigning the pre-distortion logic and processing logic into groups is a way of providing a flexible system with portions that can be configured differently so that the system can be arranged to function efficiently for many different types of signals. In some cases the multiple antenna system may be used by multiple operators and/or for multiple applications. Certain operators or applications will require the pre-distortion function to be more regularly updated, whereas for others the amplifier operation and signals may be relatively stable and a low rate of updating, with a corresponding low power consumption may be acceptable. Being able to flexibly assign the feedback paths and processing logic provided for each group allows the frequency of updating the pre-distortion function to be increased or decreased as required. If such flexible assignment is used in conjunction with configurable routing of input and/or output signals then the flexibility of the system is further increased.

A fourth aspect of the present invention provides a computer program which when executed by a processor is operable to control said processor to form steps in a method according to a third aspect of the present invention.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which.

DESCRIPTION OF THE EMBODIMENTS

Figure 1A:
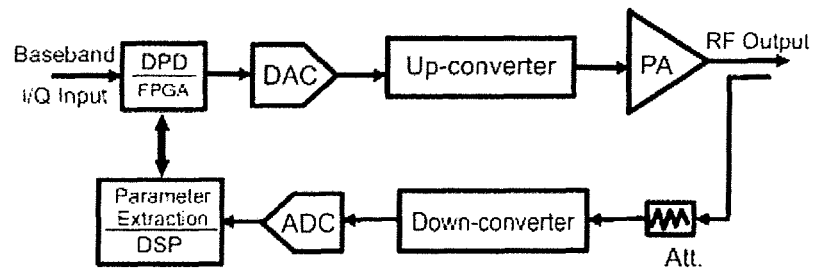
FIG. 1A illustrates a feedback path for updating a pre-distortion function applied to a signal.

Before discussing the embodiments in any more detail, first an overview will be provided.

In order to provide linear RF transmitters in a multiple antenna system such as a Massive MIMO system, a system based on applying a digital pre-distortion function to a forward data signal is proposed, wherein the digital pre-distortion function is generated and updated using a feedback signal, the feedback signal being provided via a dynamic feedback path. In this way a feedback signal may be selected for a particular input forward data signal for a particular time, which results in feedback signals not being provided for some input signals for some of the time. This reduces power requirements.

Furthermore, in some cases the feedback paths are shared between input signals, such that where the feedback path is not providing a feedback signal for one input it is diverted to provide it for a different input, such that the processing logic that compares the input signal and the processed output signal can be shared between forward data paths reducing the hardware requirements. In some cases, the circuitry used to process the output signal to make it suitable for the comparison that is the attenuator, down converter and ADC are also shared between forward data paths reducing again hardware and power requirements.

In some cases the feedback paths, routing logic and processing logic are defined in software making them flexible and cost efficient.

Each forward data path may include: behavioral model based digital predistorter (DPD) for pre-distorting the signal, Digital-to-Analog Converters (DAC) for transforming digital signal to analog signal, Up-converter for up-converting baseband signal to the required RF frequency, RF PA for amplifying low power analog signal to high power analog signal;

while the feedback data path may include: down-converter for down-converting RF signal to the baseband or intermediate frequency (IF), Analog-to-Digital Convertor (ADC) for digitizing analog signal, parameter extraction for deriving DPD coefficients.

Several embodiments are proposed:

Physically Grouped DPD (PG-DPD) architecture with on-demand time-division multiplexing (TDM) model extractions: This architecture is proposed for dynamically sharing feedback paths and DPD parameter extraction units within physically grouped transmitters. In a Massive MIMO system for backhauling application or slowly-moving mobile application, the antenna beamforming weights or MIMO precoding coefficients will be stable for a period. Then the data streams that are shaped by those spatial multiplexing coefficients are also relatively stable within a time frame, thus the traffic that drives the power amplifiers are pseudo-stationary. Moreover, once the RF power amplifiers are operating in a thermally-stable state, the device-dependent DPD coefficients are statistically stable with little variations. Putting those two points in consideration, DPD parameters for RF transmitters will not change greatly over a period, so that it is not necessary to update the DPD coefficients very frequently for every single branch. Based on this experimental evidence, we propose a RF PA linearization approach where DPD coefficients can be estimated and updated in an on-demand periodic manner. In this way it will be efficient to share the DPD parameter extraction unit in an on-demand manner among multiple transmitters, and to estimate and update DPD coefficients for different transmitters in a TDM (time division multiplexed) way for Massive MIMO system.

Logically Grouped DPD (LG-DPD) architecture with dynamically configured group parallel processing: this architecture is proposed as efficient RF power amplifier linearization for dynamically-configured Logically-grouped RF transmitters. In order to reduce the CAPEX (capital expense) and OPEX (operating expense) for providing telecom services, there is a general trend towards sharing the telecom infrastructure between multiple operators. That is to say, the same expensive telecom infrastructure, such as Massive MIMO type system (or large scale antenna array system) can be shared by multiple operators, or can be shared by different applications that are run by one operator. This infrastructure-sharing feature is very important for cloud-based software defined networks (SDN). For example, a large number of RF transceivers in a Massive MIMO system can be logically (by software) grouped into multiple middle-range application-oriented sections, each of which can be used by different operators according to certain service level agreements. We propose a RF PA linearization approach for this shared infrastructure scenario with cost-effective system architecture. Particularly, the proposed architecture will process a number of DPD units by one instantiated processing function (software) on a virtualized processing module on the top of processors, like FPGA (field programmable gate arrays), ASIC (application specific integrated circuit), and this instantiated function can be dynamically mapped to the different RF-chains. In other words, unlike the conventional one-to-one mapping between DPD units and RF transmitters, this approach enables a dynamic mapping between software-defined DPD units and a dynamic group of RF transmitters. This approach can be considered as software-defined reconfigurable RF conditioning processing, which leads to a very efficient solution to ensure linearity for massive RF transmitters.

As noted above FIG. 1B shows a simplified diagram of a Massive MIMO hub-transmitter with a conventional DPD solution. Baseband signals (data streams) are precoded to form a larger number of data streams (by Massive MIMO precoding module), and then pre-distorted by multiple digital predistorters. These predistorted signals are up-converted to RF frequencies by a Digital to RF Chain module, which in this case includes DAC, modulator, local oscillator and frequency mixer. Multiple RF power amplifiers are used for amplifying the RF signals, which will be radiated by large scale antenna array with antenna feeding networks. In each transmitter chain, a small amount of the power is coupled back to the sampling receiver via a feedback path with RF to Digital Chain module including frequency mixer, local oscillator, demodulator, and ADC. After synchronization and time alignment, we can compare a pair of signals comprising the original digital signal and observed digital signal to derive information on distortion that has occurred to the observed signal. DPD model extraction unit estimates the corresponding DPD coefficients by comparing the difference between the obtained time-aligned signal pair.

Here, N represents the number of the transmission branches and K represents the number of independent data streams.

Figure 2:
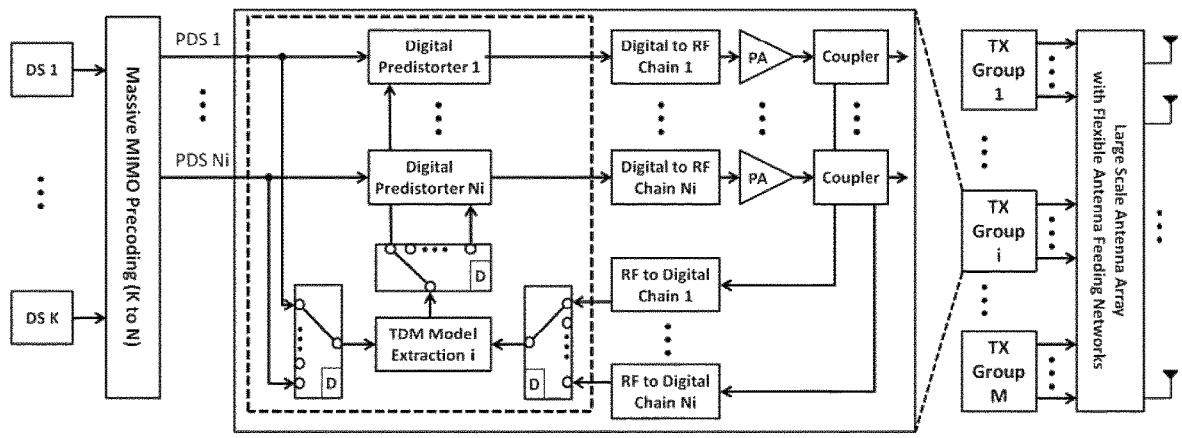
FIG. 2 schematically illustrates multiple RF transmitters which share digital pre-distortion model extraction modules within physically grouped branches.

FIG. 2 shows an embodiment where the DPD model extraction units are dynamically shared within physically grouped RF transmitters. Such that a group of RF transmitters is provided by signals from this group of RF transmitters which have a single feedback path and switching circuitry which is used to select the forward data path that is to receive feedback. Thus, the switching circuitry couples a selected feedback path such that an observed output signal is routed back through an RF to digital chain to the processing logic which compares the feedback signal with the original signal that generated the observed output signal and from this comparison determines the pre-distortion function that should be applied to the input signal to mitigate any differences between the signals caused by amplifier distortions.

FIG. 2 shows a general architecture for a generic situation, i.e., N transmitters are categorized into M groups. In a real system, different configurations can be adopted depending on the individual requirement of applications. The basic constraint is $N_1+N_2+ \ldots N_M=N$, $1 \leq M \leq N$, $1 \leq i \leq M$. The grouping of transmitters in this way may be done for a number of reasons, for example, different operators may share, perhaps software defined, Massive MIMO infrastructure to reduce the service running cost. In this case each of them will be assigned a group of transmitters, such that it makes sense to also separate the DPD functions into sub-groups physically.

Figure 1B:
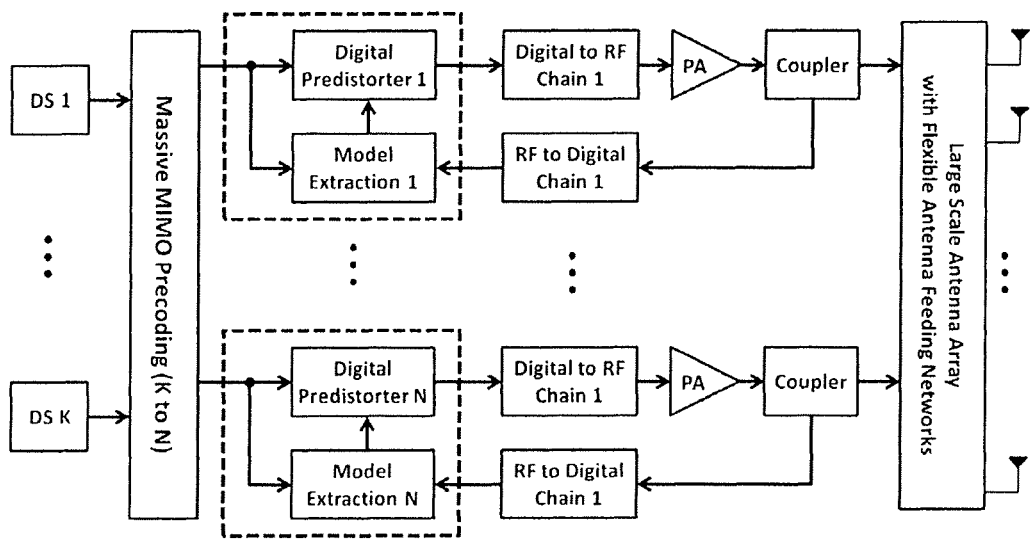
FIG. 1B illustrates the application of the feedback path of FIG. 1A in a Massive MIMO system.

As can be understood the greater the number of transmitters within a group which has a single feedback path the less frequently the pre-distortion functions will be updated. Although groups are shown here with a single feedback path it should be clear to a skilled person that more than one feedback path might be provided where more frequent updates are desirable, alternatively the groups may be formed of fewer forward data paths. For applications with relatively stationary configurations, like Massive MIMO for back-hauling/front-hauling small cells (small cells are usually not moving around like end mobile devices), when the number of the group M equals one, in other words, only one TDM model extraction unit is placed in the system, we will achieve the best complexity reduction for this architecture, but the average latency for updating DPD coefficients will correspondingly increase, which means M=1 configuration is suitable for this massive MIMO system with requirement for slow DPD updating. Particularly, when the number of the group M equals to N, the architecture is equivalent to the conventional one as shown in FIG. 1, although it may differ where selection logic allows for certain groups or subsets of groups to be powered down. The DPD coefficients updating can be done in a configurably periodic way or in an on-demand way for a particular branch. This is done by control signals transmitted to the switching circuitry which controls which forward data path is receiving feedback.

In FIG. 2, multiple RF signals are down-converted separately and switching circuitry is then used to feed the TDM model extraction unit in a periodic on-demand way, which means, if one of the RF branches needs to be updated regarding DPD coefficients (monitored by a module after precoding processing), this TDM model extraction unit will be connected to the particular feedback path, and the other feedback paths which are not used at that moment can be powered off for saving more power. In some cases the RF to digital chains and the digital to RF chains are provided as integrated units, such that one of each is provided for each forward data path. In order to further reduce the system complexity, the switching circuitry could be moved such that rather than couple a selected RF to digital chain to a single processing unit the observed signals are provided to switching circuitry which couples them to a single RF to digital chain and corresponding processing unit, thereby reducing the number of RF to digital chains required. This is shown in FIG. 3.

Figure 3:
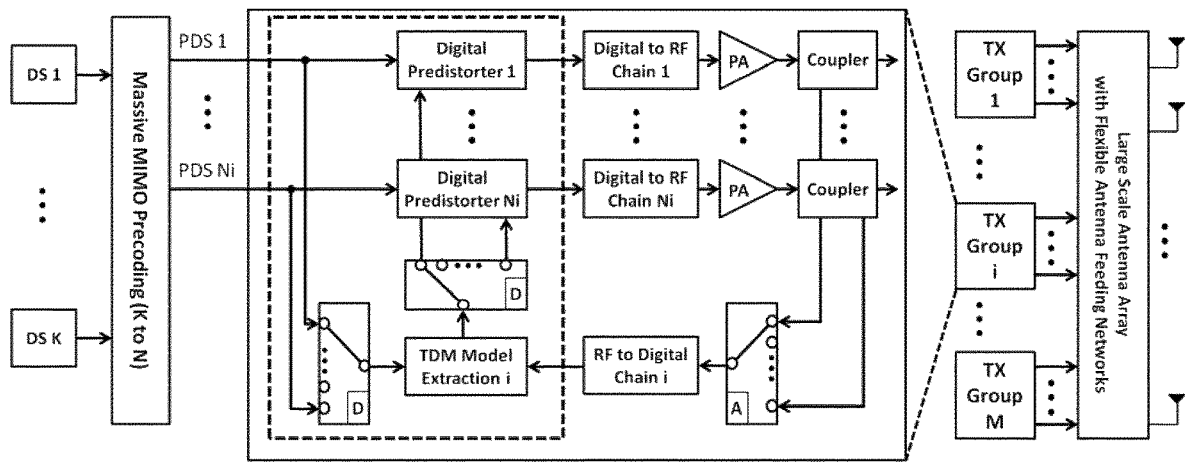
FIG. 3 schematically illustrates multiple RF transmitters which share feedback/sampling receivers and digital pre-distortion model extraction modules within physically grouped branches.

FIG. 3 shows a simplified diagram of a proposed embodiment. In this case the feedback signals are multiplexed in the analog domain, so that different feedback signals can share one RF to Digital Chain. The system complexity has been dramatically reduced due to the elimination of many feedback paths (sampling receivers).

Figure 4:
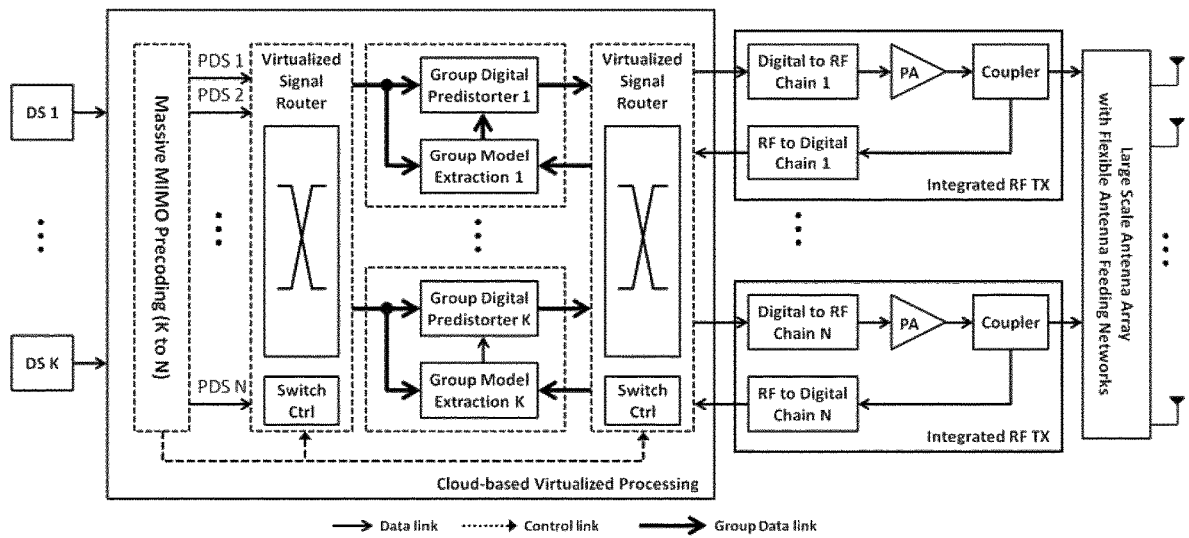
FIG. 4 schematically shows circuitry for reducing distortion in a plurality of amplified signals instantiated in software.
Figure 5:
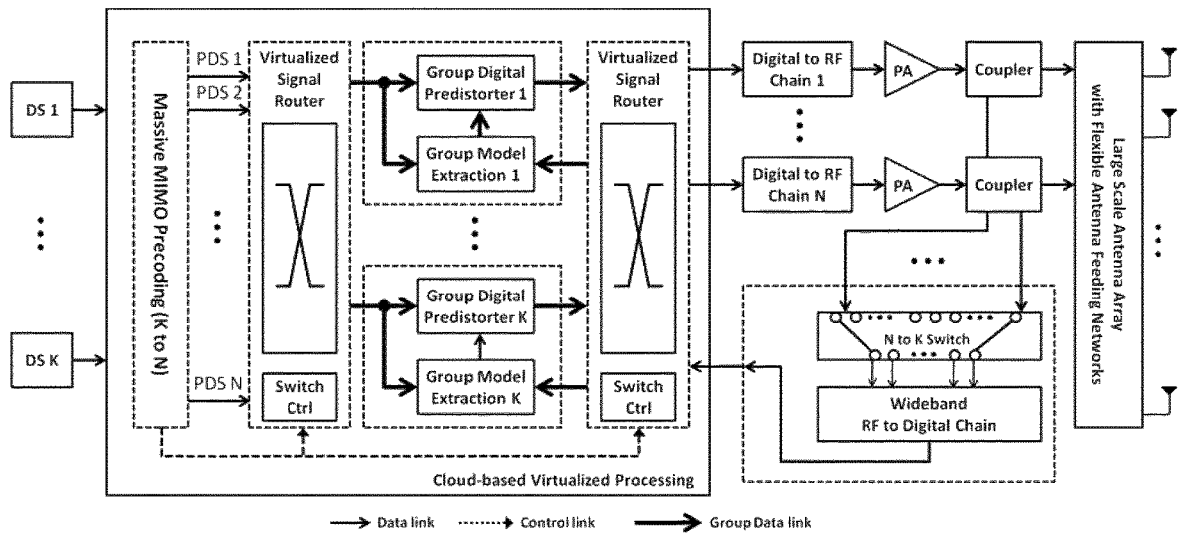
FIG. 5 schematically shows circuitry for reducing distortion in a plurality of amplified signals instantiated in software which additionally share feedback/sampling receivers.

In order to further reduce the cost of providing PA (power amplifier) linearization for massive multiple RF transmitter systems, like Massive MIMO system, we propose another flexible DPD solution to more efficiently utilize the digital/RF resources. Further extension based on the FIGS. 2 and 3, two evolved DPD system architectures are presented here for cloud-based Massive MIMO system as shown in FIG. 4 and FIG. 5, respectively.

In these two architectures, cloud-based virtual baseband units are adopted, which enable a very flexible cost-effective wireless infrastructure. This software defined virtual processing platform (cloud computing) is used for flexibly handling Massive MIMO related processing, like the centralization-oriented baseband signal processing, channel matrix estimation, calculation of the adaptive beamforming weights according to the zero-forcing precoding algorithms. We introduce two software defined signal routers between baseband digital resources and RF resources in the software defined network. The main function of these signal router units is to logically separate the RF resources and digital resources, and dynamically allocate the required RF/digital resource in an on-demand way with remote control capability. For example, in order to reduce the antenna installation cost, a reasonably large scale antenna array will be installed on top of the building in one go, however, it is not necessary to power on the full antenna array simultaneously. In order to not do this the big antenna array can be logically separated into multiple smaller arrays which may be used for different purposes. The virtualized signal router units receive the control/routing information at the switch control unit from a massive MIMO precoding unit, and they do the signal mapping according to the control messages.

For example, in a slow-updating application (like Massive MIMO system for back-hauling/front-hauling small cell), one virtualized group DPD with a single model extraction unit would be sufficient for providing multiple group PA linearization; and in a fast-updating application (like Massive MIMO system for mobile devices), multiple soft-defined group DPDs each with a model extraction unit can be dynamically allocated for providing PA linearization functions. This software defined feature can significantly reduce the cost of PA linearization for such Massive MIMO systems.

In this way, we eliminate the fixed mapping relationship between digital resources and RF resources regarding DPD applications, so that we can more efficiently utilize RF/digital resources in a flexible software-defined way for Massive MIMO type systems. Furthermore, the RF signal conditioning function, i.e., PA linearization function can be done in the software domain on virtualized processing unit by instantiating a corresponding DPD function, and multiple of those functions can be instantiated if needed. These features make this architecture suitable for real software-defined network (SDN) with software controllable wireless RF front-ends.

Moreover, if a band-limited model extraction idea is used for band-limited DPD, i.e., DPD coefficients can be efficiently extracted within the band of most interest, this band being narrower than the conventional 5 times bandwidth requirement, then the required sampling rate for capturing the feedback signal can be significantly reduced. This allows with the same digital processing capability (for example, the multiplications computing capability), us to process more model extraction functions for multiple transmitters simultaneously. This type of function is illustrated by Group Digital Pre-distorter and Group Model Extraction in FIGS. 4 and 5.

Two RF front-end options are proposed using different state-of-the-art RF components, 1) Integrated TRX (transceiver) based RF fronts, which can come with integrated DPD sampling receivers on a single chip-set as shown in FIG. 4; and 2) multiple separated feedback paths which can actually be merged and use one wideband sampling receiver to capture multiple feedback signals simultaneously as shown in FIG. 5.

In FIG. 4 and FIG. 5, K represents the numbers of the group DPD units (including digital pre-distorter and model extraction), and K is a fraction of the number of transmitters, i.e., $1 < w \cdot K < N$, where w represents the maximum number of signal streams that can be processed by one Group DPD unit simultaneously. It should be noted that the number of group model extractors and group digital pre-distorters in each group may vary and that generally there are more pre-distorters than there are group model extractors, such that the feedback function is shared between pre-distorters in a time division multiplexing manner.

Figure 6:
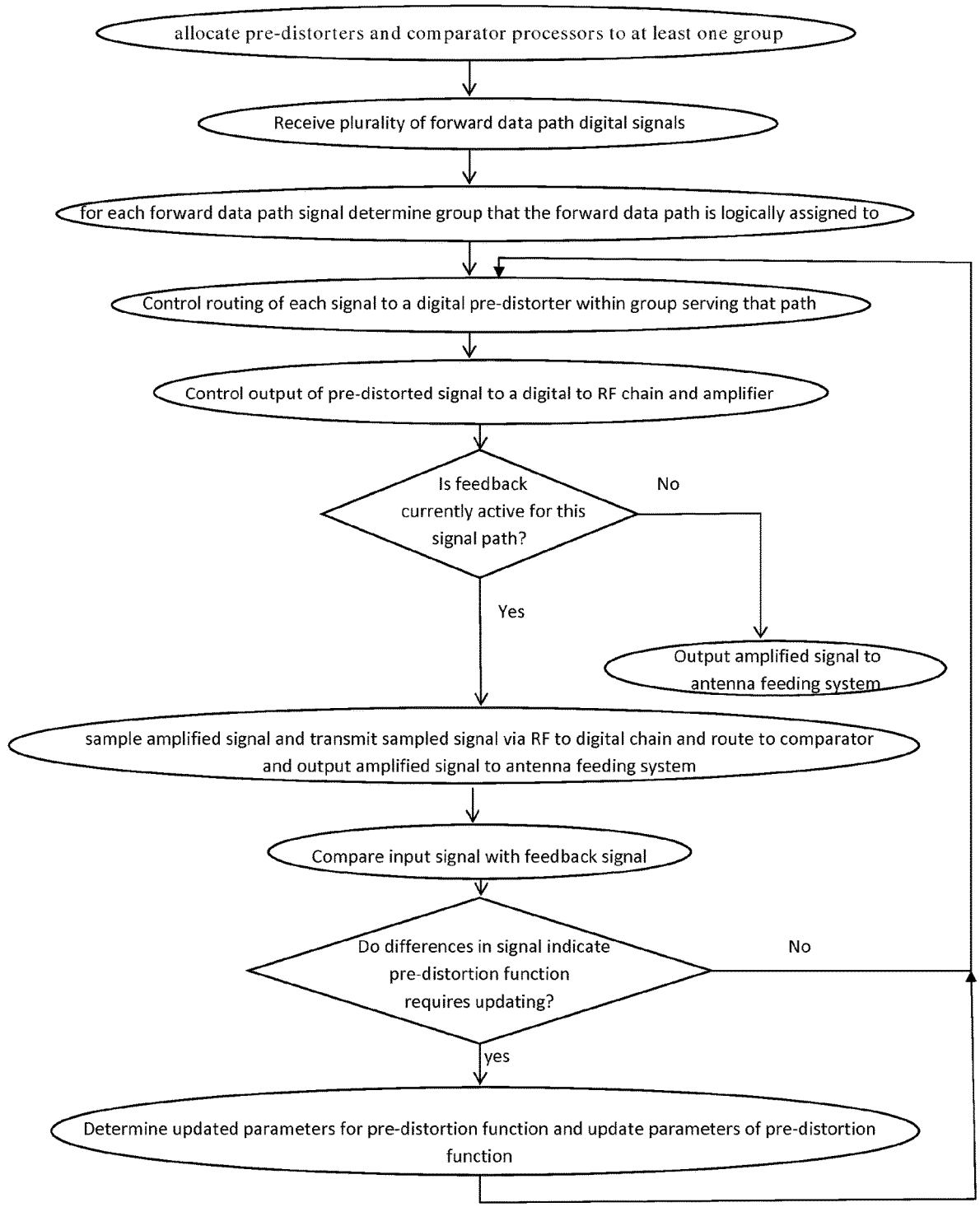
FIG. 6 shows a flow diagram illustrating steps in a method according to an embodiment.

FIG. 6 shows a flow diagram illustrating steps performed in a method according to an embodiment. The embodiment is one according to FIG. 4 or 5, where the pre-distorters and processing or model extraction circuitry are instantiated in software. Control logic assigns a number of pre-distorters and model extractors to one or more groups. The number of groups and the number of pre-distorters and model extractors in each depends on how often it is determined that the pre-distorter function is likely to change and need updating. In this regard the more often the function is changing and needs updating the fewer pre-distorters that are assigned to one model extractor. The use of groups also allows different portions of the antenna array and antenna feeding system to be operated independently, perhaps by different operators, perhaps for different applications or perhaps with some sections operational and others not. By dividing the logic into groups and assigning different forward paths to different groups each group can be operated and controlled independently.

Once the groups have been assigned, for each of the plurality of digital signals that are received on a plurality of forward data paths, it is determined from the input that they are received at which group they are currently assigned to. Routing logic then routes them to pre-distortion logic for their group. Here a pre-distortion function will be applied to the signal and the pre-distorted signal will be routed to a RF to digital chain and subsequent amplifier prior to being sent to the feeding network of an antenna array.

If a feedback path is currently active for this forward data path then the signal to be output will be sampled and fed back via a RF to digital chain and the resulting digital signal will be routed to processing circuitry in the form of the model extractor which will compare the signal with the input signal from which it stemmed. Where the comparison indicates that the pre-distortion function applied to the original signal is not functioning well then the processing circuitry will estimate new parameters for this function and the digital pre-distortion function applied to that input signal will be updated. Control circuitry will periodically change the signal which is being fed back such that each pre-distorter will have its function updated over time. This periodic change may be controlled based on time or on detected demand. The control is itself configurable and can be updated by a programmer in much the same way that the assignment of the inputs to different groups and the pre-distorter and extractor logic assigned to each group can be changed.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the Figures, including any functional blocks labelled as "processors" or "logic", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" or "logic" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. Circuitry for reducing distortions in a plurality of amplified signals to be radiated by a multiple antenna system, said circuitry comprising:
   a plurality of inputs configured to perform receiving a digital signal for a plurality of forward data paths;
   routing circuitry configured to perform routing said input digital signals received at said plurality of inputs to pre-distortion logic for applying a pre-distortion function to each of said input digital signals, said pre-distortion logic being operable to forward each of said signals towards a digital to radio frequency converter and subsequent amplifier for amplifying said signals prior to said signals being radiated;
   one or more feedback paths comprising processing logic configured to perform comparing a feedback signal generated from one of said amplified signals with said digital input signal from which said amplified signal stemmed, to determine a function to be applied by said pre-distortion logic to said input signal;
   selecting logic configured to perform selecting said input signal to be provided with said feedback;
   wherein
   said pre-distortion logic comprises a plurality of pre-distortion logic units, and said routing circuitry comprises first switching logic configured to perform selectively routing at least one of said inputs to at least one of said plurality of pre-distortion logic units.

2. The circuitry according to claim 1, wherein a number of said feedback paths is less than a number of said inputs.

3. The circuitry according to claim 1, wherein said selecting logic is configured to perform periodically selecting a different one of said inputs to be provided with said feedback.

4. The circuitry according to claim 1, wherein said selecting logic is configured to perform selecting one of said inputs to be provided with said feedback in dependence upon detected demand.

5. The circuitry according to claim 1, wherein said selecting logic is configured to perform powering down one of said feedback paths and said corresponding processing circuitry when not selected.

6. The circuitry according to claim 1, wherein said selecting logic comprises input switching circuitry configured to perform selectively routing one of said input signals to said processing logic.

7. The circuitry according to claim 1, wherein said selecting logic comprises switching circuitry configured to perform selectively routing one of said feedback signals to said processing logic and further switching circuitry configured to perform selectively connecting said processing logic to a corresponding pre-distortion logic unit.

8. The circuitry according to claim 1, said circuitry further comprising further switching logic configured to perform selectively routing signals output from said plurality of pre-distortion logic units to a plurality of outputs for connection to a plurality of radio frequency to digital converters and amplifiers selectively routing said at least one feedback signal to said processing logic.

9. The circuitry according to claim 1, said processing logic comprising a plurality of processing logic units, said circuitry being arranged in at least two groups, said at least two groups comprising at least two pre-distortion logic units and at least one processing logic unit, said at least two groups being configured to perform functioning independently of another group.

10. A multiple input multiple output radio frequency transmission system, comprising:
    a plurality of outputs configured to perform outputting a radio frequency signal to a multiple antenna feeding system;
    a plurality of inputs configured to perform receiving a digital input signal;
    circuitry configured to perform reducing distortions in a plurality of amplified signals to be radiated by said multiple antenna system according to claim 1,
    a plurality of digital to radio frequency converters and amplifiers arranged between said circuitry and said plurality of outputs;
    at least one radio frequency to digital converter configured to perform supplying a converted output signal to said one or more feedback paths.

11. The multiple input multiple output radio frequency transmission system, according to claim 10, further comprising further routing circuitry configured to perform selectively routing at least one of said output signals to said at least one radio frequency to digital converter.

12. A method of reducing distortions in a plurality of amplified signals to be radiated by a multiple antenna system comprising:
    selectively routing via switching logic a plurality of digital signals received at a plurality of inputs to pre-distortion logic for applying a pre-distortion function to said input digital signals prior to forwarding said signals towards a digital to radio frequency converter and subsequent amplifier, wherein said digital signals received at least one of said inputs are selectively routed to at least one of a plurality of pre-distortion logic units via said switching logic;
    selecting at least one input signal to be provided with feedback;
    receiving at least one feedback signal formed from a corresponding at least one of said amplified signals;
    routing said at least one feedback signal to processing logic;
    comparing at said processing logic, said at least one feedback signal with said at least one selected digital input signal from which said feedback signal stemmed; and
    determining a function to be applied by said pre-distortion logic to said at least one selected input signal.

13. A non-transitory computer readable medium comprising program instructions for causing an apparatus to perform at least the following:
    selectively routing via switching logic a plurality of digital signals received at a plurality of inputs to pre-distortion logic for applying a pre-distortion function to said input digital signals prior to forwarding said signals towards a digital to radio frequency converter and subsequent amplifier, wherein said digital signals received at least one of said inputs are selectively routed to at least one of a plurality of pre-distortion logic units via said switching logic;
    selecting at least one input signal to be provided with feedback;
    receiving at least one feedback signal formed from a corresponding at least one of a plurality of amplified signals;
    routing said at least one feedback signal to processing logic;

comparing at said processing logic, said at least one feedback signal with said at least one selected digital input signal from which said feedback signal stemmed; and determining a function to be applied by said pre-distortion logic to said at least one selected input signal.

\* \* \* \* \*